United States Patent [19]

Weaver et al.

[11] Patent Number: 4,882,754

[45] Date of Patent: Nov. 21, 1989

[54] DATA COMPRESSION SYSTEM AND METHOD WITH BUFFER CONTROL

[75] Inventors: Charles S. Weaver, Palo Alto; Constance T. Chittenden, Los Altos; Allen B. Conner, Jr., Sunnyvale, all of Calif.

[73] Assignees: Digideck, Inc., Mountain View; Digital Recording Research Limited Partnership, Menlo Park, both of Calif.

[21] Appl. No.: 204,613

[22] Filed: Jun. 9, 1988

Related U.S. Application Data

[63] Continuation-in-part of Ser. No. 89,487, Aug. 25, 1987, Pat. No. 4,802,222.

[51] Int. Cl.⁴ .......................... G10L 5/00; G11B 5/09
[52] U.S. Cl. ..................................... 381/35; 128/696; 364/413.06; 364/724.19; 375/122; 360/51; 341/95
[58] Field of Search .......................... 381/35; 375/122; 360/51

[56] References Cited

U.S. PATENT DOCUMENTS 4,413,289 11/1983 Weaver et al. .................. 360/51
4,449,536 5/1984 Weaver .
4,546,342 10/1985 Weaver et al. .

FOREIGN PATENT DOCUMENTS

WO85/02529 10/1985 PCT Int'l Appl. .

Primary Examiner—Emanuel S. Kemeny
Attorney, Agent, or Firm—Victor R. Beckman

[57] ABSTRACT

In a digital encoder, truncation is controlled by the fullness of the output rate-smoothing buffer. A signal compression system is shown for processing a stream of fixed length digital sample signals, such as audio signals, which system includes a linear digital compression filter for compression filtering the sample signal stream and generating a stream of compression-filtered signals. The compression-filtered stream is encoded by an encoder which implements a variable word length truncated code. The encoder output is supplied to a buffer for transmission to a communication channel. The encoder is controllably operable in a normal mode and in an out of range (OOR) mode. In the OOR operating mode an OOR code word together with the compression filtered signal is sent to the buffer. Buffer underflow is controlled by operation in the OOR mode when the buffer is empty or near empty. Buffer overflow is controlled by truncating sample signals supplied to the compression filter in response to a measure of buffer fullness when the fullness of the buffer exceeds a predetermined level. The level of truncation increases as buffer fullness increases. With a decrease in buffer fullness, a measure of the rate of change of buffer fullness may be used to accelerate the decrease in truncation for improved audio signal quality. Additionally, a measure of variance of the compression-filtered signal stream may be used in conjunction with control based upon a measure of buffer fullness in the control of truncation for improved audio signal quality.

38 Claims, 7 Drawing Sheets

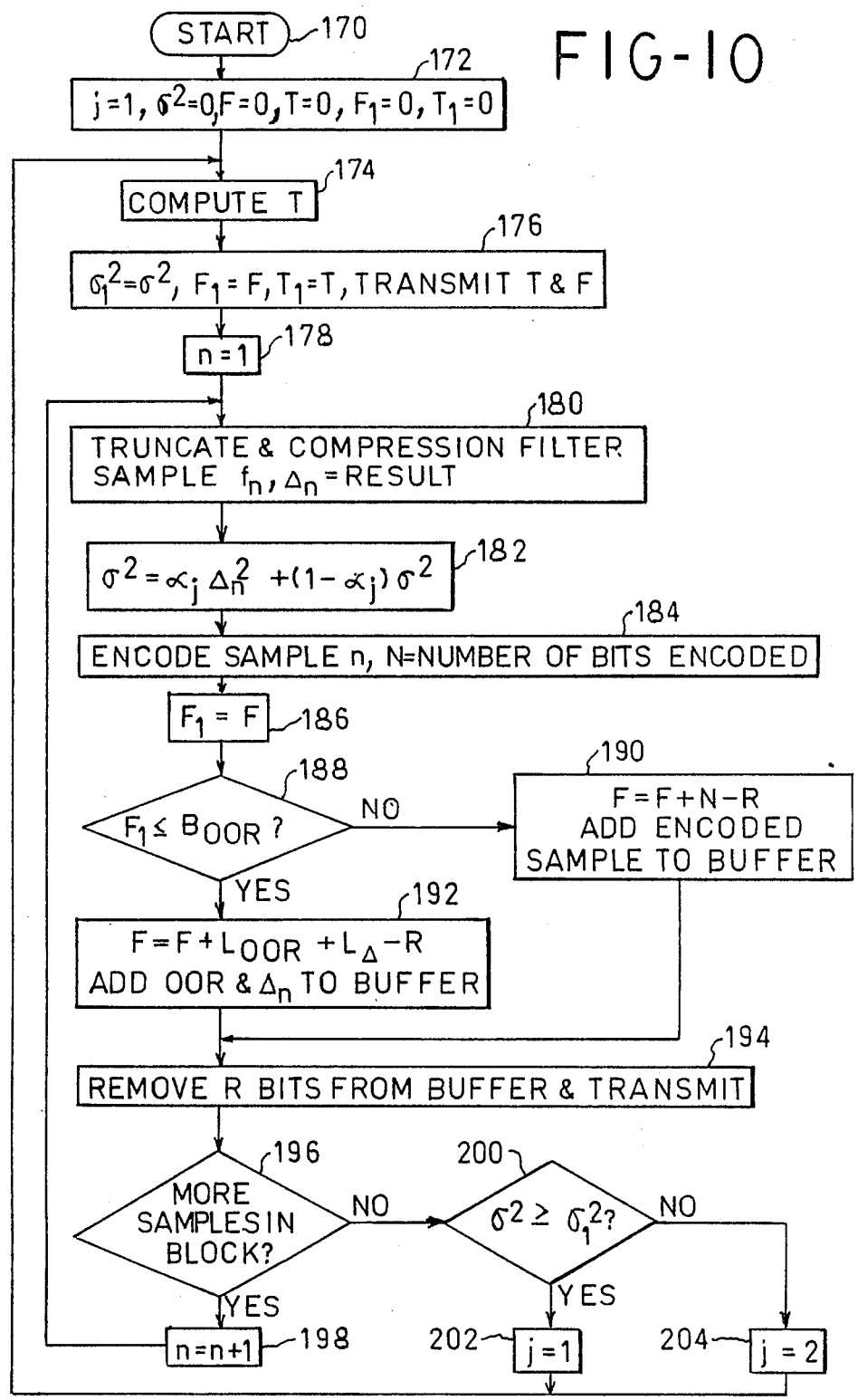

DATA COMPRESSION SYSTEM AND METHOD WITH BUFFER CONTROL

RELATED APPLICATION

This is a continuation-in-part application of U.S. patent application Ser. No. 89,487 filed Aug. 25, 1987 by Charles S. Weaver, now U.S. Pat. No. 4,802,222, issued 1-31-89 entitled Data Compression System and Method for Audio Signals.

BACKGROUND OF THE INVENTION

When data are encoded in a variable length code and transferred over a fixed rate channel, buffering must be provided to smooth the variable bit rate into the constant rate of the channel. If no means are provided for adjusting the average length per sample of the variable code, the buffer will overflow or underflow given sufficient time. In the case of high fidelity audio and practical buffer lengths, the average time to underflow or overflow is on the order of a few tens of milliseconds. With the present invention, buffer underflow or overflow is substantially eliminated and will occur only rarely.

Data compression systems which include means for converting analog signals to digital form, a digital compression filter to filter the digital signals, a variable word length encoder for encoding the compression filtered signals and buffer memory means for momentarily storing the encoded signals in preparation for transmission over a communication channel are well known as shown, for example, in PCT International Publication Number WO 85/02529, and U.S. Pat. Nos. 4,413,289; 4,449,536 and 4,546,342. U.S. Pat. No. 4,546,342 also shows use of entropy setting, or truncation, unit at the input to the digital compression filter for setting one or more of the least significant bits (LSB) of the compression filter input words to zero so as to control the average bit rate from the variable word length encoder. In the embodiment illustrated in FIG. 11 of U.S. Pat. No. 4,546,342, a mode control unit responsive to a measure of the variance of the encoded signals from the encoder is used in setting threshold levels at which different numbers of LSBs of the compression filter input words are truncated. However, with this prior art arrangement, if the average encoder output rate exceeds the transmission rate over the communication channel for a sufficient length of time, the buffer will overflow. Additionally, underflow of the buffer memory may occur if the transmission rate, which generally is constant, exceeds the average encoder output rate for a sufficient length of time.

SUMMARY OF THE INVENTION

This invention is directed to a data compression system, and more particularly to method and means for controlling the system so as to substantially eliminate buffer overflow and underflow.

Data compression systems of the general type to which this invention is directed include digital compression filter means for digital compression filtering of a digital signal stream of, say, sample signals from an analog to digital converter supplied with an audio signal, such as music. The filter output is encoded using a truncated variable word length encoder, such as a truncated Huffman encoder. The encoder output is formatted and supplied to a communication channel through a buffer for recording and/or transmission to a remote receiving location.

At a receiving station or playback unit the encoded signal is supplied to a receiver buffer and thence to a deformatting unit where headers are stripped from data blocks. The encoded signals from the deformatting unit are supplied to a decoder for decoding the same, and the decoded signals are supplied to a reconstruction filter for reconstruction filtering thereof. The reconstruction filter output is converted to analog form by use of an analog to digital converter. The receiver buffer is required since bits are supplied thereto at a constant bit rate from the channel but are removed therefrom at a variable bit rate as required by the decoder.

In accordance with the present invention a servo control is provided that increases truncation of the input to the digital compression filter as the fullness of the transmission buffer increases thereby decreasing the average encoder output bit rate below the bit rate of the channel so as to decrease the transmission buffer fullness. As buffer fullness increases an increasing number of least significant bits of the compression filter input words are truncated to further decrease the average encoder output bit rate. Transmitter buffer overflow is thereby substantially eliminated.

As noted above, the encoder implements a truncated variable word length code. Input signals to the encoder from the digital compression filter which are within a predetermined signal range are encoded using a variable word length code, such as a Huffman code, and those signals outside said predetermined signal range are transmitted along with a code word label. Such out-off-range (OOR) encoded signals are of substantially greater length than the Huffman encoded signals and substantially increase the bit rate from the encoder and into the transmitter buffer. In accordance with another aspect of the present invention, if the transmitter buffer fullness decreases below a predetermined threshold level, means are provided for changing operation of the variable word length encoder so as to operate in the out of range (OOR) operating mode regardless of the range of input signals supplied thereto. In this way, the bit rate into the buffer is increased thereby avoiding transmitter buffer underflow. With prior art arrangements wherein transmitter buffer overflow and underflow frequently occur, noise is introduced into the system thereby substantially lowering the fidelity of the transmitter output. Noise due to buffer underflow and overflow is substantially eliminated by use of the present invention.

Truncation of compression filter input signals generates noise in the filter output, which noise increases as the truncation is increased. To minimize the amount of truncation, and therefore the amount of noise generated by the filter, a second servo control loop may be employed which includes means for obtaining a measure of the standard deviation of the compression filter output. Truncation provided by operation of this loop is such that the ratio $\sigma(\Delta_n)/2^T$ is nearly constant, where $\sigma(\Delta_n)$ is the standard deviation of the filter output, $\Delta_n$, and T is the number of bits truncated. The average bit rate of the filter output $\Delta_n$ is a function of this ratio, and is maintained substantially equal to the constant bit rate of the channel by this feedback loop. By using this second servo control, noise resulting from truncation is reduced. In addition, the rate at which the truncation changed is controlled so that if the audio input is at a high level with high truncation the truncation drops rapidly if there is a sudden drop in audio amplitude.

Now, with lower truncation, the full dynamic range is available during quiet passages, assuming that the audio comprises music. With a sudden increase in loudness the truncation level is allowed to increase at a much lower rate thereby avoiding leaving the truncation at a high level in response to a short, transient, increase in the audio input.

Another modified form of this invention employs truncation control dependent upon fullness of the transmitter buffer, of the type described above, together with an adjustment based upon the rate of change of fullness of the buffer. When the change of fullness decreases, as during an audio release transient, a measure of the change of fullness is used to accelerate the decrease in truncation. When the change of fullness increases, as during an audio attack, no adjustment to truncation in response to the measure of change of fullness is required. However, it will be apparent that the increase in truncation may be accelerated in response to an increase in the measure of change of fullness, if desired. With this truncation scheme, based both on fullness and on change in fullness of the transmitter buffer (and upon the preceding truncation level), the sound of fast articulated pieces, such as piano crescendos processed by the present data compression system is substantially improved over arrangements wherein truncation is based solely upon buffer fullness.

If desired, all three truncation control schemes, based upon transmitter buffer fullness, change in transmitter buffer fullness, and standard deviation of the compression filter output, may be simultaneously employed for buffer control. In all buffer control embodiments of this invention a measure of transmitter buffer fullness is an essential element for controlling truncation and operating mode of the encoder in the prevention of buffer overflow and underflow, respectively.

The invention, together with other objects, features and advantages thereof will be more fully understood from a consideration of the following detailed description of certain embodiments thereof taken in connection with the accompanying drawings. It here will be understood that the drawings are for purpose of illustration only and that the invention is not limited to the specific embodiments disclosed therein.

BRIEF DESCRIPTION OF THE DRAWINGS

In the drawings, wherein like reference characters refer to the same parts in the several views:

FIG. 10 is a flow diagram showing transmission buffer control for use in explaining operation of the present invention.

Figure 1:
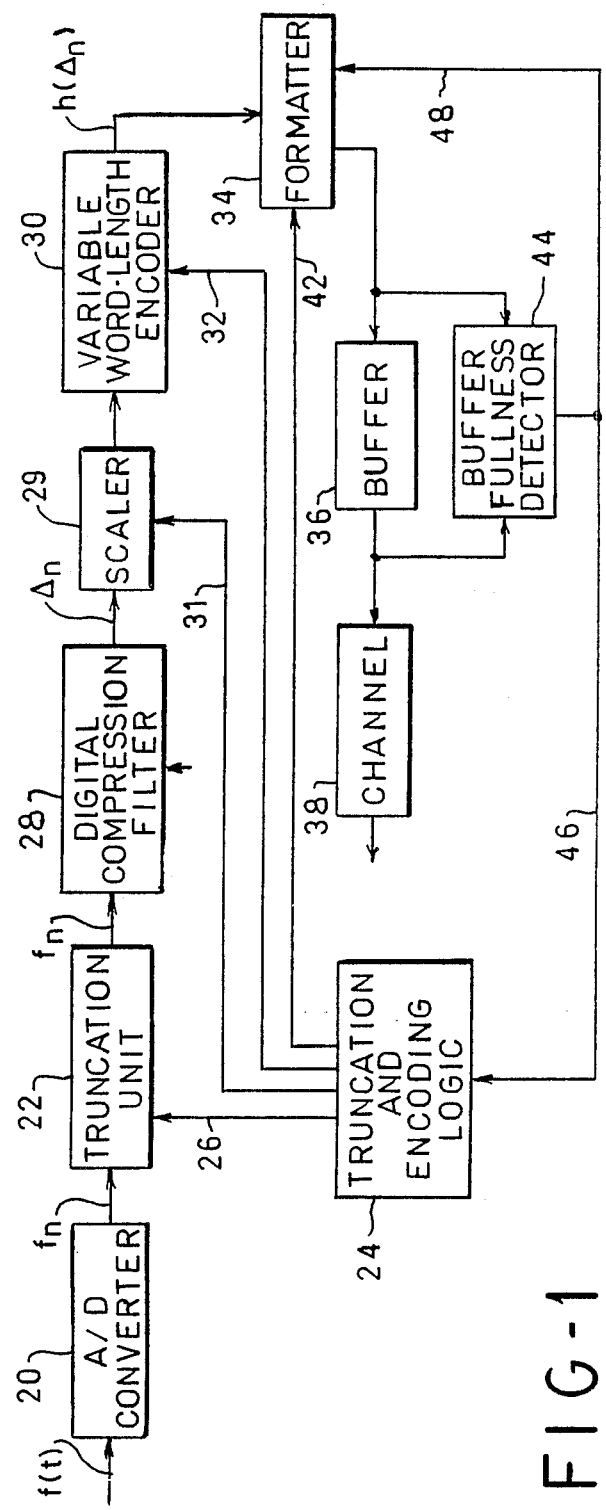
FIGS. 1 and 2 together show a simplified block diagram of a signal compression system with transmitter buffer control based upon buffer fullness embodying the present invention; a digital transmitter being shown in FIG. 1 and a receiver being shown in FIG. 2.

Reference now is made to FIG. 1 showing the transmitting portion of a data reduction system which includes novel buffer control means for use in preventing underflow and overflow of a transmitter output buffer. An analog to digital converter (A/D converter) 20 for conversion of an analog audio signal f(t) into digital form is shown, the nth sample from the analog to digital converter being identified as $f_n$. For purposes of illustration, the audio input signal may comprise a music signal which ranges in frequency from approximately 15 to 20,000Hz, and the A/D converter may operate at a sampling frequency of, say, 44,000 samples per second. and 16 bit word length.

The digital sample signal stream, $f_n$, from A/D converter 20 is supplied in blocks of, say, 128 samples, to a truncation unit 22 which controls the entropy, of the sample signal stream as by truncation, roundoff, or the like. It here will be understood that although a truncation unit 22 is shown, and operation is described hereinbelow in terms of truncation of the sample signal stream, the invention is not limited to truncation, and the use of the term "truncation" includes "roundoff" and the like, operations. At the truncation unit one or more least significant bits of the sample signal stream may be set to zero, or one, under control of an output signal from truncation and encoding logic 24 supplied thereto over truncation control line 26. For simplicity, the same reference character $f_n$ is used to identify the input to, and output from, truncation unit 22. When truncation unit 22 operates with zero truncation, it will be apparent that the input and output sample signals are, in fact, identical.

The output from truncation unit 22 is supplied to a linear digital compression filter 28 for linear compression filtering thereof. Linear digital compression filtering is well known and is shown in publications mentioned above. In the above-mentioned PCT publication WO 85/02529, compression filters which include zeros on the unit circle in the Z-plane at zero, $\pm 41.41°$, $\pm 60°$, $\pm 90°$, $\pm 120°$ and $180°$ degrees are shown. In some embodiments, and adaptive compression filter is employed which minimizes the bit count from variable word length encoder 30 to which the compression filter output is supplied through a scaler 29. The compression filter output, identified as signal values $\Delta_n$, comprises signals which may have the same word length as the input signals $f_n$. Thus, for purposes of illustration, with 16 bit sample signals $f_n$ supplied to the input, the compression filter output comprises compressed signal values $\Delta_n$ which also are 16 bit word length. Scaler 29 simply may comprise a shift register for shifting the compression filter output, $\Delta_n$, to the right by an amount equal, for example, to the level of truncation supplied at truncation unit 22. A control signal at line 31 from logic unit 24 controls the amount of right shifting by scaler 29.

The variable word length encoder 30 implements a truncated variable word length code, such as a truncated Huffman code. Truncated variable word length encoders are disclosed in detail in the above-mentioned U.S. Pat. No. 4,413,289 entitled, "Digital Recording and Playback Method and Apparatus" by Charles S. Weaver et al, issued Nov. 1, 1983; U.S. Pat. No. 4,449,536 entitled, "Method and Apparatus for Digital Data Compression" by Charles S. Weaver, issued May 22, 1984; U.S. Pat. No. 4,546,342 entitled, "Data Compression Method and Apparatus" by Charles S. Weaver et al issued Oct. 8, 1985, and PCT International Publication Number WO 85/02529 entitled "Data Compression System and Method for Processing Digital Sample Signals" by Charles S. Weaver, published Jun. 20, 1985. The entire disclosure of these U.S. patents and PCT International Publication specifically are incorporated by reference herein.

Briefly, the Huffman encoding technique makes use of the fact that the compression filter reduces the entropy of the compression filter output, $\Delta_n$, so that there can be a reduction in the total number of bits in the Huffman encoded signal, designated $h(\Delta_n)$. With a truncated code, the most frequently occurring values of $\Delta_n$, of say between ±31, are encoded using the variable word length code; with the most frequently occurring value being encoded using the shortest code word. For out-of range (OOR) signal values; i.e. those signal values outside of the range of ±31, an OOR code word is concatenated to the actual signal value, $\Delta_n$, and subsequently transmitted. If, for example, the OOR code word is six bits in length, then the encoded signal output for all OOR signals would comprise the actual 16 bit signal value, $\Delta_n$, plus the 6 OOR code word, for an encoder output word 22 bits in length. In accordance with one feature of this invention, input signals to the encoder within the range of ±31 which normally are encoded using the variable word length code may be encoded as OOR signals under control of a control signal from truncation and encoding logic unit 24 supplied thereto over encoder control line 32. Operation in this OOR encoding mode regardless of the input signal values is provided to avoid underflow of the transmitter buffer, in a manner described in detail hereinbelow.

The encoder output $h(\Delta_n)$ is supplied to a formatter 34 where blocks of encoded sample signals are provided with headers. From formatter 64, the formatted blocks of encoded signals are passed through buffer 36 to communications channel 38 for transfer to a receiver. A signal from logic unit 24 is supplied to formatter 34 over line 42 for inclusion in the block headers to identify the scaling employed at the transmitter. At the receiver, this information is supplied to a descaler for proper descaling operation. Changes in truncation and changes in scaling are implemented only between blocks of sample signals.

The fullness of buffer 36 is detected by buffer fullness detector 44 connected to the input and output of the buffer, which detector is responsive to the difference in the number of bits written into buffer 36 and the number read out therefrom. Obviously, if channel 38 operates at a constant bit rate, the number of bits removed is a direct function of time, and use of this fact may be made in determining the number of bits removed from the buffer. To determine the fullnes of buffer 36, knowledge of the number of bits written into the buffer together with the length of time bits are removed therefrom may be used without the need for a direct measurement of the number of bits removed therefrom. Also, the number of bits entered into the buffer may be determined ahead of the buffer by, for example, counting the bit count output from encoder 30 together with the number of bits used in the block headers. However, for purposes of illustration and simplicity, a buffer fullness detector 44 simply is show in FIG. 1.

Figure 2:
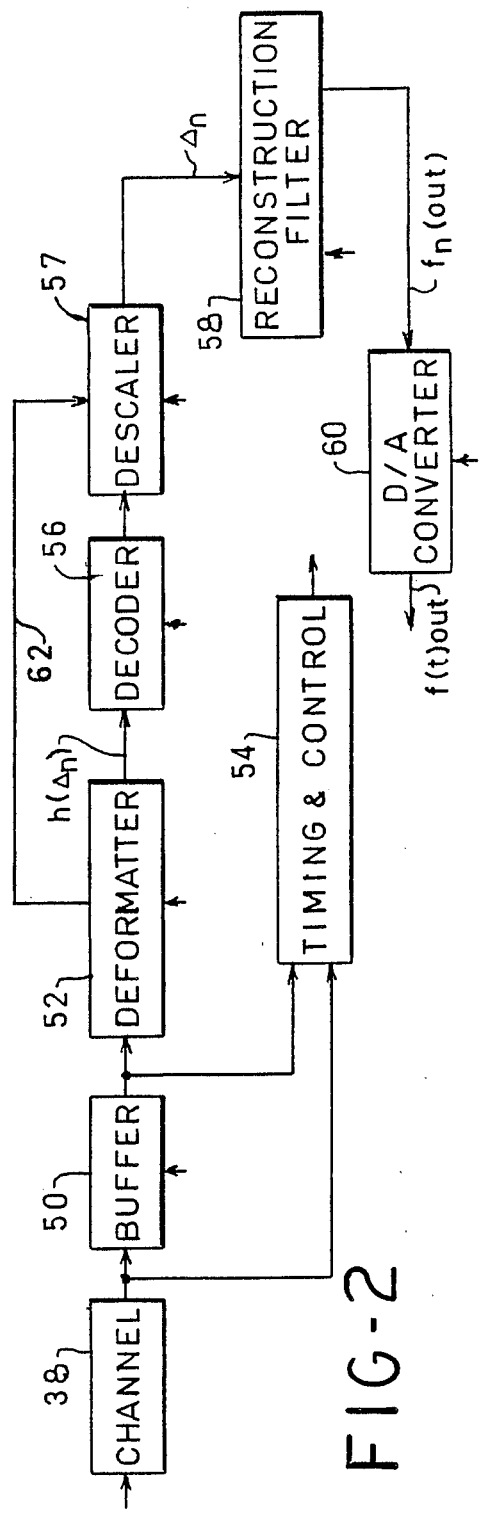

The output from detector 44 comprises a buffer fullness signal, F, which is supplied to logic unit 24 over line 46, where it is used in the determination of how much truncation, if any, should be employed at truncation unit 22 to avoid buffer overflow, and whether encoder 30 should be operated in the OOR operating mode to avoid buffer underflow. During receiver start up, the transmitter buffer fullness signal also is supplied to formatter 34 over line 48 for transmission to the receiver for use in controlling partial loading of a receiver buffer before receiver decoding operation begins. Receiver buffer control start up operation is described in detail hereinbelow following a description of the receiver shown in FIG. 2.

It will be apparent that formatter 34 may be provided with other inputs for inclusion in the headers such as a signal to identify the compression filtering employed if an adaptive compression filter is employed. In FIG. 1, only the buffer fullness signal and a signal to identify the scaling employed are shown supplied to the formatter in addition to the encoder output Reference now is made to FIG. 2 wherein a receiver is shown which includes a receiver buffer 50 to which input signals from channel 38 are supplied. The output from receiver buffer 50 is supplied to a deformatter 52 and to a timing and control unit 54. The deformatter includes means for stripping the headers from the data blocks. From deformatter 52, the encoded signals $h(\Delta_n)$ are supplied to a digital decoder 56 for decoding the same. The decoded signals are supplied to a reconstruction filter 58, through descaler 57, for reconstruction filtering thereof, and the reconstruction filter output $f_n(out)$ is converted to analog form f(t)out at digital to analog converter 60.

The code word which identifies the scaling employed at the transmitter, which is stripped from the data stream by deformatter 52, is supplied over line 62 to the descaler 57. At descaler 57 the decoded signals are left-shifted by the same amount that they were right-shifted at scaler 29 under control of a control signal from deformatter 52. During receiver start up, a transmitter buffer fullness signal is supplied to timing and control unit 54 from channel 38, for controlling when decoding is to begin in response to measures of fullness of the transmitter and receiver buffers.

Transmitter Buffer 36 Fullness Control By Buffer Fullness

Figure 3:
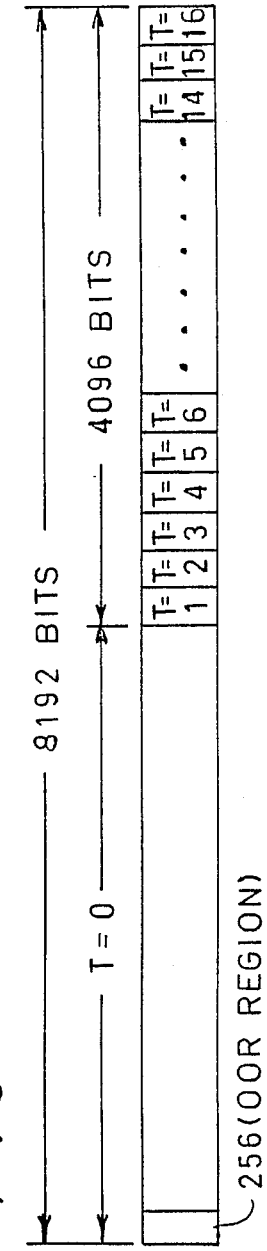
FIG. 3 shows the division of the range of fullness of an 8192 bit buffer for use in explaining operation of the invention shown in FIGS. 1 and 2.

The division of the range fullness of the transmitter buffer 36 for different truncation levels is illustrated in FIG 3, to which figure reference now is made. It here is assumed that input signals, $f_n$, to truncation unit 22 are 16 bits in length. For purposes of illustration, a 8192 bit buffer is shown, and the range of fullness is divided into regions that correspond to a truncation level. For example, when the buffer is equal to or less than half full, there is no truncation, i.e. T=0. When $4096 < F \leq 4096 + 256$, there is one bit of truncation;

when 8192−256<F≦8192 the truncation is 16 bits, where F= fullness of the buffer. There will be delay between a change in the bit rate from encoder 30 and a change in truncation level provided by truncation unit 22. The bin widths of 256 bits when the buffer is over half full have proven satisfactory with 16 bit audio and sampling rates of 31,500 to 41,000 samples/sec. and block lengths of up to 128 samples. Changes in truncation usually will be ±1.

When 0≦F≦256, the out of range (OOR) code word followed by the actual binary value of $\Delta_n$ are transmitted. As described above, this is done even though $\Delta_n$ might not be in the OOR region of the code table. An underflow control signal supplied to encoder 30 over line 32 from logic unit 24 places encoder 30 in this OOR encoding mode. When operating in the OOR encoding mode, the number of bits per sample entered into buffer 36 will exceed the number of bits per sample removed therefrom. Consequently, the fullness of buffer 36 is increased until it is greater than 256 bits thereby preventing underflow of the transmitter buffer.

Figure 4:
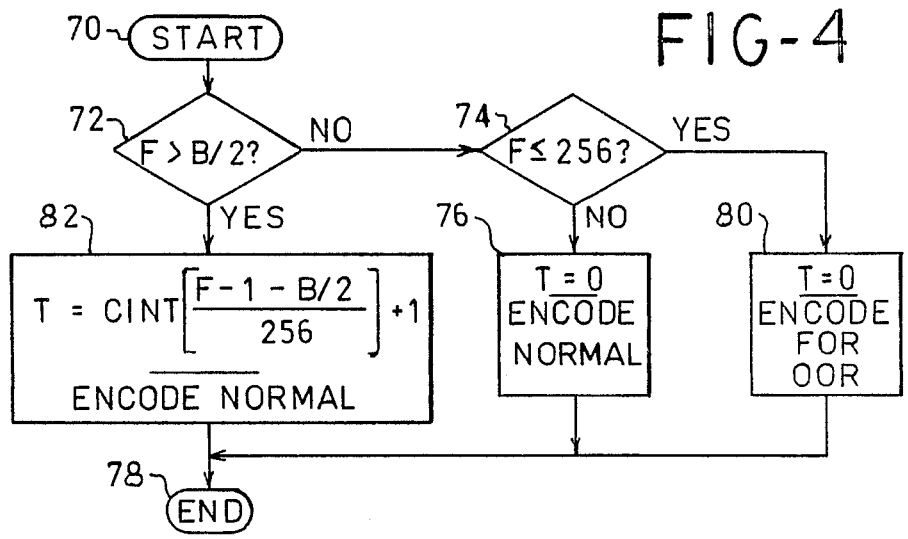
FIG. 4, is a flow diagram showing computation of truncation from transmitter buffer fullness alone, for use in explaining operation of the FIG. 1 arrangement.

A flow diagram showing operation of logic unit 24 for control of the transmitter buffer fullness in response to a measure of the buffer fullness is shown in FIG. 4, to which figure reference now is made. After START step 70, decision step 72 is entered where the fullness, F, of the transmitter buffer is compared with one half the size of the buffer, B/2, which in the example above is 4096 bits. Decision step 72 determines whether or not the buffer is greater than one-half full. If the decision is negative no truncation is required and decision step 74 is entered to determine whether or not the buffer contains less than 256 bits. If the decision is negative, i.e. if the buffer does not contain less than 256 bits, then step 76 is entered where the truncation level provided by truncation unit 22 is set to zero (T=O) and encoder 30 is operated normally to implement a truncated variable word length code. From step 76, END step 78 is entered. The process is repeated after the transmission of each block of signals.

If the transmitter buffer 36 contains 256 bits, or less, then decision step 74 is affirmative and step 80 is entered where the truncation level provided by truncation unit 22 again is set to zero. Now, however, to avoid underflow of the buffer, encoder 30 is operated in the OOR mode where, as described above, the OOR code word is concatenated with compression filter output signal $\Delta_n$ whether or not $\Delta_n$ is in the code table.

If the transmitter memory is greater than one-half full, decision step 72 is affirmative and step 82 is entered where the amount of truncation to employ is determined by use of the following equation, $$T = CINT\left[\frac{F - 1 - B/2}{256}\right] + 1$$

where CINT is the round-off function. The calculated truncation value is used to set the level of truncation provided by truncation unit 22, and encoder 30 is operated normally to implement a truncated variable word length code. It will be apparent that the operation of logic unit 24 is readily implemented in hardware or in software using a digital computer. Truncation at truncation unit 22 simply involves setting one or more of the least significant bits of the sample signals $f_n$ to a one or a zero.

Conditions For No Reciver Buffer 50 Overflow or Underflow

As noted above, receiver buffer 50 is required since the bit stream rate at the receiver end of channel 38 is constant, but the decoder 56 requires bits at a variable bit rate. Assuming no bit errors, the conditions necessary to guarantee no receiver buffer overflow or underflow will now be described.

At time n the nth code word, with a length of $L_n$ bits, is entered into the transmitter buffer 36. At the same time R bits are removed from the buffer and sent through the channel 38. The change, $\Delta F_{tn}$, in the buffer fullness is $$\Delta F_{tn} = L_n - R \tag{1}$$

At the time the nth code word is removed from the receiver buffer 50 the change in the receiver buffer fullness, $\Delta F_{rn}$, is $$\Delta F_{rn} = R - L_n \tag{2}$$

(R bits are added and $L_n$ bits are removed.)

The transmitter buffer fullness, $F_{tn}$, at the time the nth code word is added is $$F_{tn} = \sum_{i=1}^{n} \Delta F_{ti} + F_{t0} \tag{3}$$

where $F_{t0}$ is the initial fullness. Similarly the receiver buffer fullness is:

$$F_{rn} = \sum_{i=1}^{n} \Delta F_{ri} + F_{r0} \tag{4}$$

From Eqns. (1), (2), and (4):

$$F_{rn} = F_{r0} - \sum_{i=1}^{n} \Delta F_{ti} \tag{5}$$

Since $$-\sum_{i=1}^{n} \Delta F_{ti} = F_{t0} - F_{tn} \tag{6}$$

then $$F_{rn} = F_{r0} + F_{t0} - F_{tn}$$

If there is no under or overflow in the transmitter buffer $$0 \leq F_{tn} \leq B$$

where B is the length in bits of the transmitter buffer 36. Let the receiver buffer 50 also have a length of B bits. From Eq. (6) $F_{rn}$ is maximum when $F_{tn}=0$. Thus if there is to be no receiver buffer over flow $$F_{r0} + F_{t0} \leq B$$

When $F_{tn}=B$, $F_{rn}$ is minimum. Then, if there is no underflow, $$F_{r0} + F_{t0} \geq B$$

Therefore $$F_{r0} + F_{t0} = B$$

is a necessary condition that guarantees no over or underflow the receiver buffer, provided there is no over or underflow at the transmitter.

When the receiver is started $F_{rO}$ should be set to B−F, where F is the transmitter buffer fullness at receiver start-up. Then $$F_{rn}=B-F_{tn} \qquad (7)$$

Since there always will be a total of B bits stored in the two buffers, the delay from the input of the transmitter buffer to the output of the receiver buffer will be B/R sample intervals and thus will be constant.

Receiver Buffer Control Start Up

Figure 5:
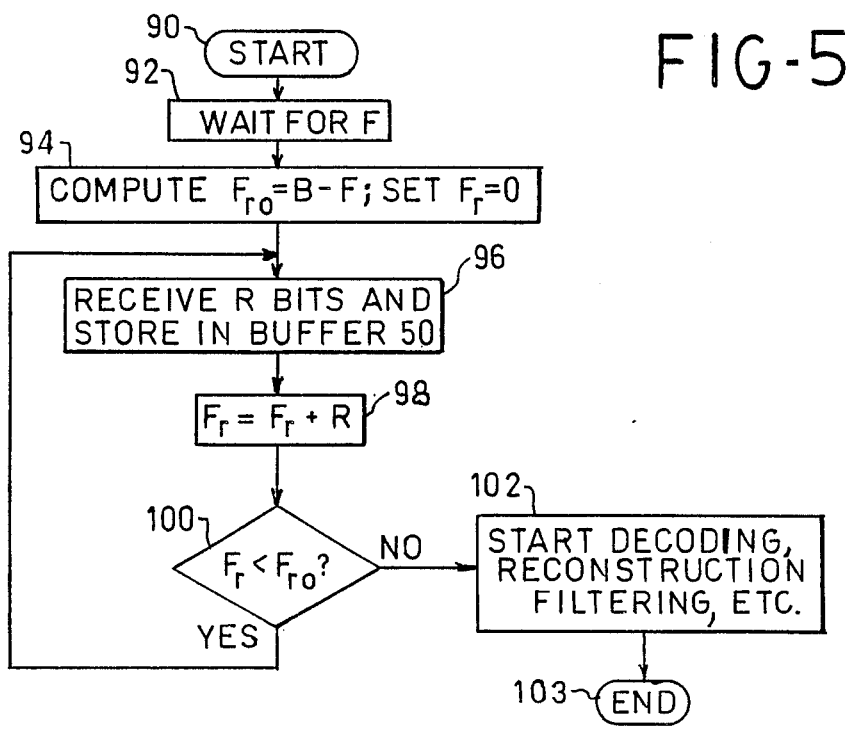
FIG. 5 is a flow diagram showing receiver buffer control start-up.

A flow diagram showing receiver buffer control at start up is shown in FIG. 5, to which figure reference now is made. At start step 90 power is turned on and, at step 92, the receiver waits for a transmitter buffer fullness signal, F, from the transmitter. As noted above, when the transmitter buffer 36 is partially filled following start up, a transmitter buffer fullness signal, F, is transmitted giving the number of bits contained in the transmitter buffer. At the next step 94, the measure of fullness, $F_r$, of the receiver buffer 50 is set to zero since the reciver buffer is empty at start up. Also, the fullness of receiver buffer needed to begin decoding, $F_{rO}$, is computed by subtraction of F from B, the buffer size. As noted above, transmitter and receiver buffers of equal size are employed whereby the value of B is the same for both buffers.

Next, at step 96, R number of bits are received and stored in receiver buffer 50. The fullness, $F_r$, of the receiver buffer is updated at step 98 by adding R to the existing buffer fullness value. At decision step 100, the receiver buffer fullness, $F_r$, is compared to the required receiver fullness $F_{rO}$ to determine if the actual fullness is less than that required. If the decision is affirmative, step 96 is reentered and an additional R number of bits are received and stored in the receiver buffer. The buffer fullness is updated at step 98 and decision step 100 is reentered. If the receiver buffer fullness, $F_r$, is no longer less than the required fullnes, $F_{rO}$, for startup, step 102 is entered at which time the decoding, reconstruction filtering and D/A conversion operations of decoder 56, reconstruction filter 58 and D/A converter 60, respectively, are initiated. The start up segment of the receiver operation is terminated when end step 103 next is entered.

Figure 6:
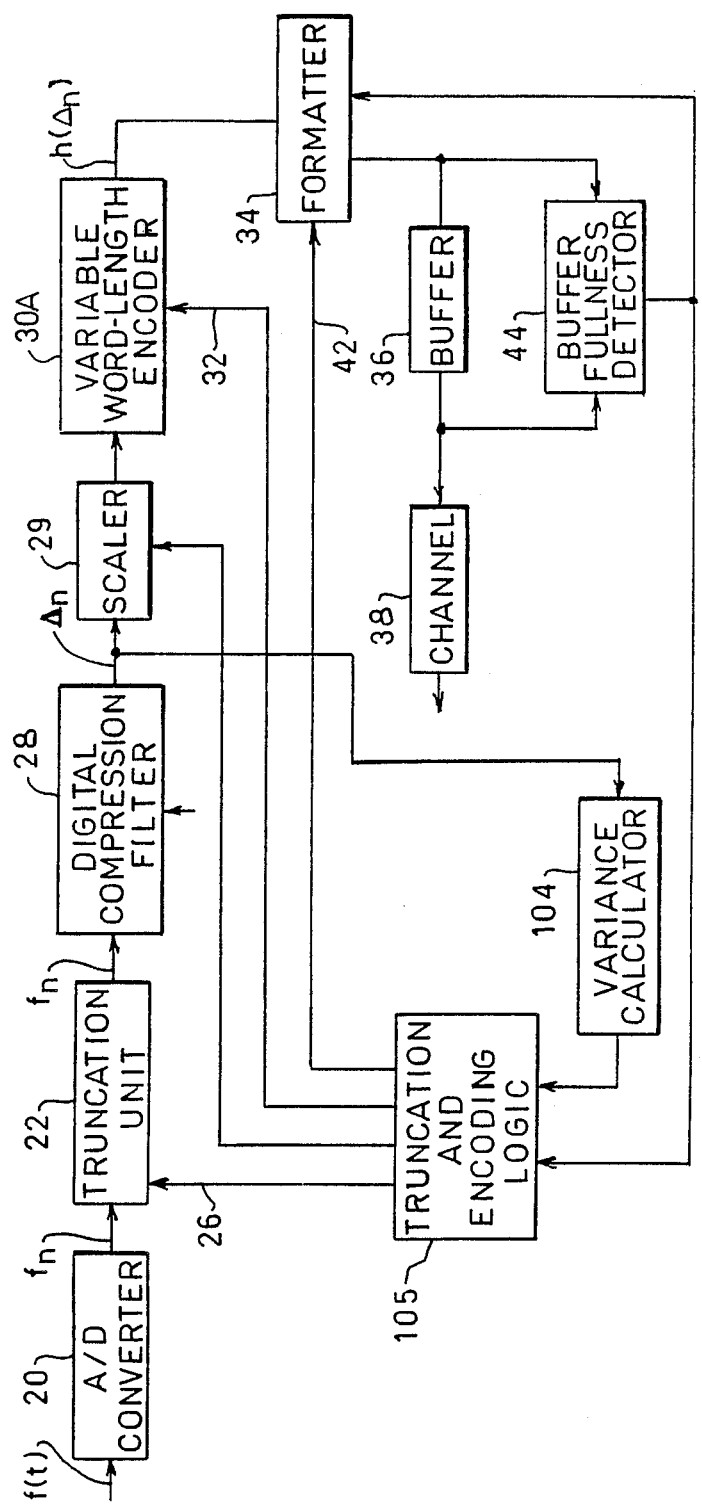
FIG. 6 is a simplified block diagram which is similar to that of FIG. 1 but showing a modified form of transmitter wherein truncation is controlled using measures of transmitter buffer fullness and variance of the digital compression filter output.

Transmitter Buffer 36 Fullness Control By Buffer Fullness and Standard Deviation, $\sigma(\Delta_n)$ Although satisfactory transmitter buffer control can be obtained using a measure of fullness, F, alone, listening tests have shown that the quality of some types of music can be improved by incorporating $\sigma(\Delta_n)$ into thecontrol. A modified form of transmitter which combines measures of buffer fullness, F, and $\sigma(\Delta_n)$ in the servo control is shown in FIG. 6, to which figure reference now is made. The FIG. 1 and FIG. 6 embodiments include many of the same elements and the description of these elements, which are provided with the same reference numbers, will not be repeated here. The transmitter of FIG. 6 includes a variance calculating unit 1041 responsive to the output, $\Delta_n$, from the digital compression filter 28 for determining the variance of blocks of said compression filtered signals. The variance signal, $\sigma^2(\Delta_n)$ determined by unit 104 is supplied to a truncation and encoding logic unit 105 along with the buffer fullness signal from detector 44. The truncation unit 22 and encoder 30A are controlled by outputs from logic unit 105 in the same manner described above with reference to FIG. 1.

It can be shown that the entropy of the $\Delta_n$, H($\Delta_n$), when A/D converter 20 output is gaussian (typical of most music and voice) is:

$$H(\Delta_n) \approx 2 + \log_2\left(\frac{\sigma(\Delta_n)}{2^T}\right)$$

where, as above, T is the number of bits that are truncated. The most efficient variable length code is the "Huffman Code", which will realize an average code word length, L, that is slightly greater than H($\Delta_n$). Thus the equation for L is nearly the same as for H($\Delta_n$), or $$L = 2 + \log_2\left(\frac{\sigma(\Delta_n)}{2^T}\right) + \epsilon \qquad (8)$$

where typically $\epsilon=0.1$. In the following discussion the $\epsilon$ will be dropped which will not significantly change the results. The code efficiency, E, is defined as:

$$E = \frac{H(\Delta_n)}{L}$$

The Huffman Code will have maxmium efficiency only at a single ratio of $\sigma(\Delta_n)/2^T$. In this embodiment the code is designed to maximize E for the ratio that will make L in Eq. (8) equal to R, where R is the number of bits removed from the transmitter buffer each sample time. For example, if R equals 6, the code will be designed for $\sigma(\Delta_n)/2^T=16$.

The truncation, T, can have only integer values, so that almost never will $$\sigma(\Delta_n)=2^T \cdot 2^{R-2} \qquad (9)$$

(from Eq. (8) L would be equal to R). In this embodiment T is chosen to make the magnitude $$|\sigma(\Delta_n)-2^{T+R-2}|$$

a minimum. In practice it is more convenient to calculate the variance, $\sigma^2(\Delta_n)$, and minimize $$\sigma^2(\Delta_n)-2^{2(T+R-2)}$$

by setting a series of thresholds on $\sigma^2(\Delta_n)$ in the following manner: For T=0, Eq. (9) will be true when $\sigma^2(\Delta_n)$ equals $2^{2(R-2)}$. If $\sigma^2(\Delta_n)$ increases by a factor of 4, T=1 will satisfy Eq. (9), the first threshold will be set to half this increase, and when $\sigma^2(\Delta_n)$ exceeds this threshold the truncation is 1 bit ($\sigma^2(\Delta_n)>2^{2R-3}$). The next threshold, which sets the truncation to 2, is four times as large as the first truncation, and in general the next truncation is four times its predecssor. Thus if $$\sigma^2(\Delta_n)<2^{2R-3}; \text{ then } T=0 \qquad (10)$$

If $$2^{2(i-1)} \cdot 2^{2R-3} \leq \sigma^2(\Delta_N) < 2^{2(i)} \cdot 2^{2R-3} \qquad (11)$$

then T = i for i > 0. The variance can be calculated by the following equation.

$$\hat{\sigma}^2(\Delta_n) = \alpha j \Delta n^2 + (1 - \alpha_j)\hat{\sigma}^2(\Delta n - 1) \qquad (12)$$

where $\hat{\sigma} n^2(\Delta_n)$ is the variance estimate at the nth sample time, and $0 < \alpha_j < 1$; j = 1 or 2.

The $\alpha_j$ can have different values depending on whether $\hat{\sigma}n^2$ is increasing or decreasing. If the audio (e.g. music) is at a high amplitude with a high truncation, the truncation should drop rapidly if there is a sudden drop in amplitude because the full dynamic range should be available during quiet passages. If there is a sudden increase in loudness, fidelity will not be lost by a gradual increase in the truncation level. However, if the level is allowed to increase at a rapid rate, a short transient may leave the truncation at a high level.

Therefore two time constants, or two values of $\alpha_j$ are used in Eq. (11). When $\hat{\sigma}_n^2(\Delta_n)$ is increasing a smaller value is used; when it is decreasing the value is larger. Experiments indicate that the ratio of the two values should be about 10:1. When the sampling frequency is 44,100 samples per sec., 0.01 and 0.001 are good values for the $\alpha$'s.

Figure 7:
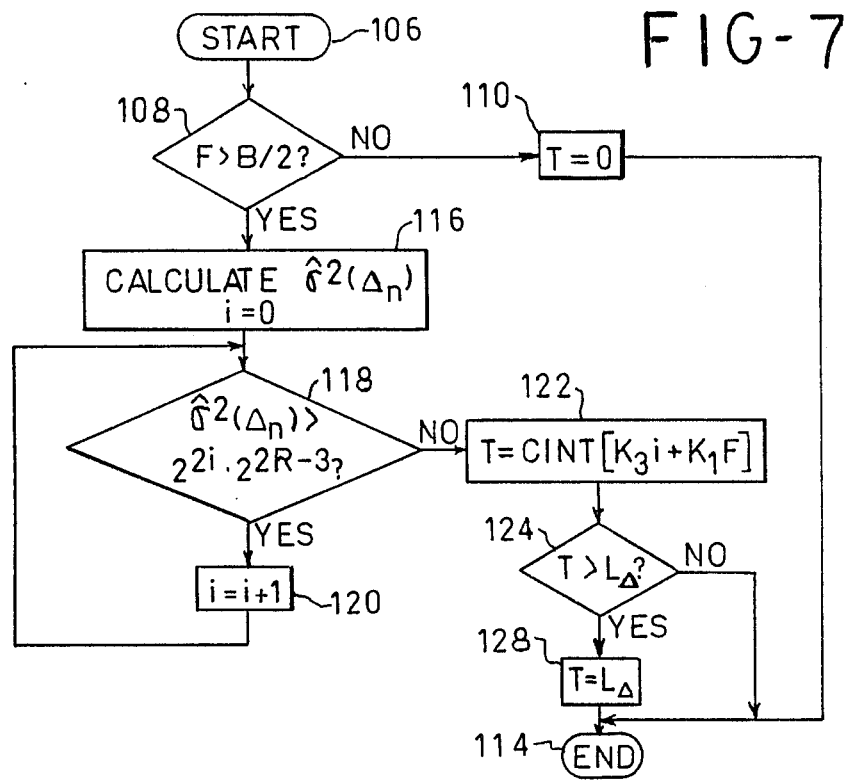
FIG. 7 is a flow diagram for use in explaining operation of the FIG. 6 embodiment of the invention.

In FIG. 6, an adaptive variable word length encoder 30 A is shown whereby different variable word length codes are implemented dependent upon the measure of variance. The encoder simply may include a plurality of code tables, with the code table selected being under control of the measure of variance. Changes in the code employed are effected only between blocks of sample signals, and formatter 34 is supplied with a signal which identifies the code employed, which signal is included in the block headers. At the receiver, the signal which identifies the code employed is stripped from the blocks and supplied to the decoder to identify the code to be employed in decoding the block of encoded sample signals. A data compression system which employs different codes for encoding the compression filter output is shown in the above-mentioned U.S. Patent No. 4,546,342.

referece now is made in FIG. 7 wherein a flow diagram for the computation of truncation based upon both transmitter buffer fullness and a measure of variance of the compression filter output, $\Delta_n$, is shown, which may be employed in the FIG. 6 embodiment of the invention. After start step 106, decision step 108 is entered where it is determined if the fullness, F, of transmitter buffer 36 is greater than one-half the buffer size. If the buffer is less than one half full, decision step 108 is negative and step 110 is entered where the truncation is set to zero. End step 114 then is entered.

If decision step 108 is affirmative, step 116 is entered where an estimated value of variance of the compression filter output ($\Delta_n$) is calculated using, for example, Equation (12), and the value of i is set to 0, where i is an integer. As described above with reference to Equation (12), a larger value of $\alpha$ is employed in Equation (12) when the variance is decreasing than when it is increasing.

Decision step 118 then is entered to determine if the estimated variance $\hat{\sigma}^2(\Delta_n)$ calculated at step 116 is greater than $2^{2i} \cdot 2^{2R-3}$. This decision step is obtained from Equation (11) used for determining truncation levels. If decision step 118 is affirmative, the value of i is incremented by one (1) at step 120 and decision step 118 is reentered. This looping continues until $2^{2i} \cdot 2^{2R-3}$ exceeds $\hat{\sigma}^2(\Delta_n)$ at which time the decision is negative and step 122 is entered for calculation of truncation, T.

The value of truncation, T, calculated at step 122 is the sum of weighted values, $K_3 i + K_1 F$, rounded of to an integer, where $K_3$ and $K_1$ are weight constants, i is the value of the integer employed in decision step 118 which is dependent upon a meausure of variance, and F is transmitter buffer fullness.

From step 122, decision step 124 is entered to determine if calculated truncation from step 122 is greater than the word length of $\Delta_n$. If not, the truncation to be employed at truncation unit 22 is the calculated truncation value, and END step 114 is entered. If the indicated truncation T, from step 122 is greater than the length, in bits, of $\Delta_n$, then maximum truncation of $L_\Delta$ is employed at truncation unit 22, where $L\Delta$ is the length in bits of $\Delta_n$. From step 128, END step 114 is entered.

If the buffer contains fewer than 265 bits, then the out of range (OOR) operating mode is employed in the manner described above to avoid transmitter buffer underflow. Reference is made to the flow chart of FIG. 4 which shows means for determining when a block of compression filter output signals, $\Delta_n$, is to be encoded using the OOR encoding mode. For simplicity, the flow charts of FIG. 7, and FIGS. 8 and 9 described hereinbelow, do not include similar steps for determining when OOR encoding is to be employed for the prevention of underflow.

Computation of Truncation from Transmitter Buffer Fullness, F, Change in Transmitter Buffer Fullness, $\dot{F}$, and Previous Truncation As noted above, there is a noticeable potential degradation in the reproduction of audio transients (attackes and releases) when the truncation level is controlled solely by the transmitter buffer fullness. By using a measure of variance of the compression filter output, together with separate time constants for truncation control during attacks and releases, as described above, substantial improvement is provided. In another modified form of this invention use is made of buffer fullness and changes in transmitter buffer fullness for control of truncation, which also results in noticeable improvement in signal reproduction of audio transients over that obtained using a control based solely on buffer fullness.

With this embodiment, two separate control schemes $T_A$ and $T_B$ may be envisioned wherein $T_A$ is a scheme based solely on buffer fullness, and is the more heavily weighted scheme when the buffer is full. $T_B$ is an adjustment scheme based on the presence of attacks or releases, and is applied when the transmitter buffer is at low levels of fullness. A block diagram of a transmitter employing this modified form of transmitter buffer control is the same as that shown in FIG. 1 and described above. However, operation of truncation and encoding logic unit 24 differs from that of FIG. 1 to not only make use of buffer fullness measurements supplied thereto from buffer fullness detector 44, but also to employ changes in buffer fullness which occur from block to block, and to use the prior truncation setting. The changes in buffer fullness values are readily calculated at logic unit 24 from the buffer fullness values supplied thereto. Consequently, no separate block diagram drawing is required for use in explaining operation of this embodiment of the invention.

The control scheme, $T_A$, based upon buffer fullness is:

$$T_A = \frac{F}{B/16} - 1 \qquad (13)$$

where F = buffer fullness and B is the buffer size, both in bits. Unlike the FIG. 1 arrangement, the transmitter buffer 36 is envisioned as divided into 16 equal size bins with "suggested" truncation levels ranging from 0 to 15. Thus B/16 represents the bin size.

The $T_B$ adjustment is:

$$T_B = T_{old} + C \cdot (1 - \text{sgn}\dot{F}) \frac{\dot{F}}{N_b} \qquad (14)$$

where $\dot{F}$ is the difference in fullness in the buffer (bits in— bits out) arising from processing the latest block, $T_{old}$ is the truncation employed when transmitting the previous block, the sgn ( ) function, "signum", represents the sign of $\dot{F}$, and $N_b$ is the number of samples in a block of data. C is a gain coefficient which amplifies the impact of the attack/release adjustment. It will be seen that the adjustment formula "recommends" no increase in truncation from the present value ($T_{old}$) during an attack, since 1−sgn $\dot{F}$ equals zero when transmitter buffer fullness increases. With a decrease in buffer fullness. 1-sng$\dot{F}$ equals 2, and since $\dot{F}$-$N_b$ is a negative value when $\dot{F}$ decreases during a release, a decrease in truncation by a factor of 2C levels is recommended during a release. In a practical arrangement wherein C=1, a reduction in truncation by two is "recommended" if $\dot{F}$ averaged one bit per sample below the nominal channel rate.

As noted above, the $T_A$ truncation control scheme is more heavily weighted when the buffer is full, and the $T_B$ scheme is more heavily weighted as the buffer fullness decreases. The resulting adaptive truncation is:

$$T_{new} = \left(\frac{F}{B}\right)T_A + \left(1 - \frac{F}{B}\right)T_B \qquad (15)$$

or $$T_{new} = \left(\frac{F}{B}\right)\left(\frac{F}{B/16} - 1\right) + \qquad (16)$$
$$\left(1 - \frac{F}{B}\right)\left(T_{old} + (1 - \text{sgn}\dot{F})\left(\frac{\dot{F}}{N_b}\right)\right)$$

The actual truncation value used, on the next block, is an integer from 0 to 15, derived, for example, from $T_{new}$ by rounding to the nearest integer in this range. Obviously, other smoothing could be applied here, if desired. With this form of invention there is significant improvement in the audio of fast articulated pieces, such as piano crescendos whereas, without this control, a more slowly decaying truncation level causes the audio to sound as if the pianist had stepped on the soft pedal just as the crescendo chord is struck.

Figure 8:
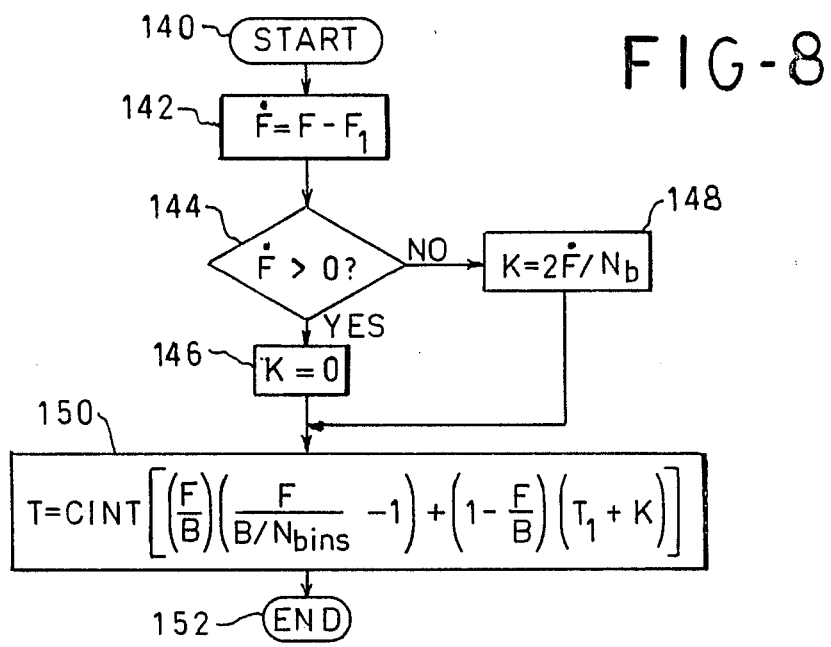
FIG. 8 is a flow diagram showing computation of truncation from measurements of truncation, transmitter buffer fullness, change in transmitter buffer fullness and the previous truncation value, for use in explaining operation of a transmitter employing a modified form of truncation and encoding logic unit.

A flow chart showing computation of truncation, T, from buffer fullness, $\dot{F}$, rate of change of fullness, F, and previous truncation, $T_1$, is shown in FIG. 8, to which figure reference now is made. From start step 140, computation step 142 is entered wherein the change in fullness, $\dot{F}$, of the transmitter buffer is calculated by subtraction of the previous fullness, $F_1$ from the present fullness. Next, decision step 144 is entered where it is determined if the change in fullness is greater than zero. If the decision is affirmative, indicating that the buffer is filling, step 146 is entered wherein a value K is set to zero. The value K is employed in the calculation of truncation performed in step 150 in a manner described below. If, on the other hand, the change in buffer fullness, $\dot{F}$, is less than zero indicating that the buffer is emptying, then decision step 148 is entered where a value of K is calculated using the equation K=2$\dot{F}$/$N_b$ where, as noted above $N_b$ is the number of samples in a block of data. The equation, K=2$\dot{F}$/$N_b$ is derived from Equation (14) for the conditions that sgn $\dot{F}$ is negative and that C equals 1. Since the equation is only employed when $\dot{F}$ is negative, K always comprises a negative value when the equation is used.

From steps 146 and 148, step 150 is entered where truncation to be employed is calculated from the equation $$T = CINT\left[\left(\frac{F}{B}\right)\left(\frac{F}{B/N_{bins}} - 1\right) + \left(1 - \frac{F}{B}\right)(T_1 + K)\right] \qquad (17)$$

where:
CINT is the rounding function,
F is transmitter buffer fullness,
B is transmitter buffer size,
$N_{bins}$ is the number of bins into which the transmitter buffer is divided; e.g. 16 bins,
$T_1$ is the previous truncation level, and
K is derived from step 146 or 148.

In Equation (17) the component $$\frac{F}{B/N_{bins}} - 1,$$

based upon the buffer fullness, is weighted by the factor F/B. The other component, $T_1$ +K, based upon the previous truncation level and the amount of decrease in buffer fullness, is weighted by the factor 1—(F/B). At low levels of buffer fullness the $T_1$+K component is most heavily weighted for a most rapid decrease in truncation level. End step 152 is entered from truncation computation step 150. As with other arrangements, a new truncation level is computed for each block of sample signals transmitted. As described above, the truncation and encoder control logic unit also functions to place encoder 30 in the OOR operating mode whenever the transmitter buffer fullness decreases below a predetermined level of, say, 256 bits. For simplicity, this operation is not included in the flow diagram of FIG. 8.

Computation of T from F, $\dot{F}$, and Variance, $\sigma^2(\Delta_n)$

Figure 9:
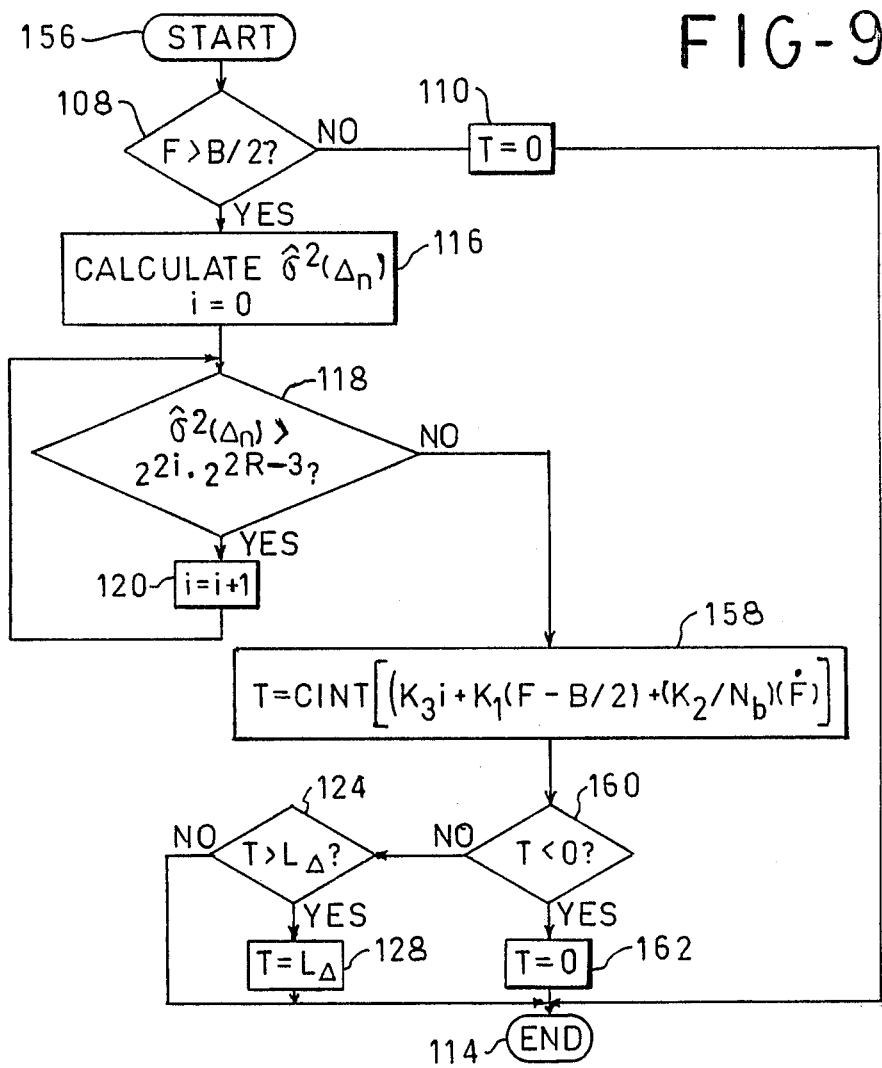
FIG. 9 is a flow diagram showing computation of truncation from measure of buffer fullness, rate of change of buffer fullness, and variance of the output from the digital compression filter.

If desired, the truncation employed may be based upon measures of transmitter buffer fullness, change in fullness, and variance of the output from compression filter 28. A flow diagram showing this type of operation is shown in FIG. 9, to which figure reference now is made. It will be seen that the diagram of FIG. 9 includes some of the same steps as employed in the flow diagram of FIG. 7, and, therefore, the same reference characters are used for steps in FIG. 9 which correspond to steps employed in FIG. 7. Following start step 156, step 108 is entered where it is determined if the transmitter buffer fullness, F, exceeds one half the buffer size and, if the buffer is one half full, or less, the truncation level is set to zero at step 110 whereupon end step 114 is entered. If the transmitter buffer is greater than one half full, then $\sigma^2(\Delta_n)$ is calculated at step 116, and i is set to zero. The value of i to be used in calculating truncation based upon variance is calculated using steps 118 and 120.

When decision step 118 is negative, truncation calculated step 158 is entered where the truncation, T, value to be employed is calculated using the formula $$T = CINT[K_3 i + K_1(F - B/2) + (K_2/N_b)(F - \dot{F}_1)] \tag{18}$$

The first term of Equation (18), $K_3 i$, as described above with reference to FIG. 7, comprises the product of constant $K_3$ and i, where i is an integer determined at steps 118 and 120, and is dependent upon the variance, $\sigma^2(\Delta_n)$. The second term, $K_1(F - B/2)$, comprises the product of constant $K_3$ and $F - B/2$. Since step 158 only is entered if the transmitter buffer 36 is greater than one-half full, the term $F - B/2$ is always positive. The third term, $(K_2/N_b) \dot{F}$ is dependent upon the change in fullness, $\dot{F}$, which may be either a positive or negative value dependent upon whether the buffer fullness is increasing or decreasing, respectively. The change in fullness is weighted by a factor of $K_2/N_b$ where $K_2$ is a constant and $N_b$, as described above, is the number of samples in a block of data. The sum of the terms is rounded, using the CINT function, and step 160 is entered. Suggested values for $K_1$, $K_2$, and $K_3$ are $2^{-8}$, 0.1 and 0.5, respectively.

At decision step 160, the value of truncation T calculated at step 158 is compared with zero and if it is smaller than zero, then step 162 is entered where the truncation level is set to zero. If the value of truncation T calculated at step 158 is greater than zero, decision step 160 is negative and decision step 124 is entered. At decision step 124, if the calculated truncation value T exceeds the number of bits in $\Delta_n$, then step 128 is entered where the truncation level is set to $L_\Delta$ (the number of bits in $\Delta_n$). If, on the other hand, decision step is negative, the truncation level remains the value calculated at step 158 and END step 114 is entered. End step 114 also is entered from steps 128 and 162.

Transmitter Buffer Control

Control of transmitter buffer 36 now will be described with reference to the flow diagram of FIG. 10, to which figure reference now is made. After start step 170 the buffer control system is initialized at step 172 by setting j=1, $\sigma^2=0$, F=0, T=0, $F_1=0$, and $T_1=0$. Next, using initial values from step 172, the truncation, T, to be used is computed at step 174. Any of the above-described methods of computing truncation may be used including those shown in the flow diagrams of FIGS. 4, 7, 8 and 9. For purpose of description, a truncation scheme that makes use of a measure of variance, $\sigma^2$, of the compression filter output is shown in FIG. 10. At step 176, values for the previous variance, fullness, and truncation, $\sigma^2_1$, $F_1$ and $T_1$ are set equal to the new values thereof, and the new values of T and F are transmitted.

At the next step 178, n is set equal to 1, and step 180 is entered whereupon a sample $f_n$ at the input to truncation unit 22 is truncated, if T>0, and compression filtered at filter 28 to provide a compression filter output, $\Delta_n$. Step 182 is entered where variance, $\sigma^2$, of the compression filter output is calculated using, for example, Equation (12) in which case it will be an estimated value, $\hat{\sigma}^2(\Delta_n)$. Since i was initialized to a value of 1 at step 172, the initial calculation of variance will employ the constant $\alpha_1$.

At the next step 184 the nth sample is encoded at encoder 30, or 30A, and the number of bits N of the variable code word used is saved. Step 186 then is entered where the previous fullness value $F_1$ is updated by setting the same to F. After step 186, decision step 188 is entered where it is determined if the fullness value, $F_1$, is less than or equals $B_{OOR}$, the upper limit for the out of range buffer which, in the above examples, equals 256 bits. If $F_1$ is not equal to or less than 256 bits, the decision is negative and step 190 is entered where the fullness value F is updated by adding the number of bits N in the code word to F and subtracting the number of bits R removed from the buffer. Also, the encoded sample is written into buffer 36. If decision step 188 is affirmative, then step 192 is entered where the fullness value F is updated by adding to the present fullness value, F, the length of the code word which identifies out of range words, $L_{OOR}$, and the length of the sample, $L_\Delta$, and subtracting from this total, R, the number of bits removed from the transmitter buffer.

Step 194 is entered from steps 190 and 192 where R bits are removed from the buffer and transmitted. Decision step 196 is entered where it is determined if more samples are in the block. If more samples are included in the block, step 198 is entered wherein the value of n is incremented and step 180 is reentered in preparation for transmission of another sample. If no more samples remain in the block, as determined by subtracting the number of samples, n, transmitted from the number of samples in a block, decision step 196 is negative and decision step 200 is entered. At step 200, if $\sigma^2 \geq \Delta_1^2$, step 202 is entered where j is set to equal 1. If step 200 is negative, step 204 is entered where j is set to equal 2. The use of one or the other of these two constants in the calculation of variance dependent upon whether variance is increasing or decreasing is described above with reference to Equation (12). After calculation of j, step 174 is reentered in preparation for the transmission of the next block of sample signals.

A Linear Analysis of Fullness Control The Linear Model

Let $d_n$ be the difference between the constant number of bits/sample that are removed from the buffer and the length of the code word with no truncation, when the code table covers the full range of the $\Delta_n$ (no OOR). Truncation of $T_n$ bits will reduce the length of the nth code word (on the average) by $T_n$ bits. In the model the change in F is $\Delta F_n = d_n - T_n$. The fullness will be the sum of $\Delta F_n$ which will be represented by an integration in the model.

Figure 11:
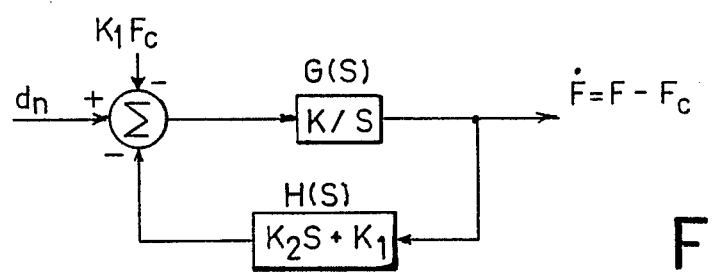
FIG. 11 is a block diagram of a linear model for use in a linear analysis of buffer fullness control.

The truncation will be equal to a constant times the fullness plus a constant times the rate of change of fullness, i.e. $T_n = K_1 F_n + K_2 \dot{F}_n$. The fullness that the servo will attempt ot maintain will be $F_c$. FIG. 11 is the model block diagram, to which figure reference now is made.

The Analysis

The closed loop transfer function is $$\frac{G(S)}{1 + G(S)H(S)} = \frac{K/S}{1 + (K_2S + K_1)K/S} \quad (18A)$$

$$= \frac{K}{(KK_2 + 1)S + KK_1}$$

$$= \frac{\frac{K}{KK_2 + 1}}{S + \frac{KK_1}{KK_2 + 1}}$$

To find the dc gain set $S=0$.

$$K_{DC} = \frac{\frac{K}{KK_2 + 1}}{\frac{KK_1}{KK_2 + 1}} = \frac{1}{K_1} \quad (19)$$

Note that $K=1$ when the unit of time equals the interval between samples because, if the output of the summer equals one, F will increase by one in one sample interval. Then the average fullness will be $$\frac{1}{K_1} \overline{d_n},$$

where $\overline{d_n}$ is the average of $d_n$.
The time constant is $$\frac{KK_2 + 1}{KK_1} = \frac{K_2 + 1}{K_1} \quad (20)$$

(The Laplace transform of $C/(s+1/\tau)$ is $Ce^{-t/\tau}$, where $\tau$ is the time constant.) If for example, $\overline{d_n}=2$ (the average word length is 2 bits more than transmission rate) and the dc set point is to be at 4096 (or $2^{12}$), then $K_1=2^{-11}$.

Note that where T is changed only at the end of a block of, for example, 128 samples, as in the above-described arrangements, $$\frac{dF}{dt} = \frac{F_n - F_{n-1}}{128} \quad (21)$$

where $F_n$ is the fullness at the end of the nth block; i.e., take the average derivative over 128 samples.

Buffer Instability Caused by Compression Filter Truncation Noise Multiplication All the compression filters increase the standard deviation of the input truncation noise; i.e., the standard deviation of the filter output due to truncation at the input will be larger than the truncation noise standard deviation.

A Huffman code has an average word length, L, that is closely approximated for gaussian encoder inputs by $$L = 2 + \log_2 \frac{\sigma}{q} \quad (22)$$

where $\sigma$ is the standard deviation of the input and the q is the quantizing level.

$$= 2^T \quad (23)$$

It is well known that the standard deviation of quantizing noise is $q/\sqrt{12}$. Therefore the standard deviation of the truncation noise is $2^T/\sqrt{12}$ and this noise will be white. It also is well known that when the input to a finite impulse response digital filter (G(Z) is all zeros) is white, the output standard deviation is the input standard deviation multiplied by $$M = \left( \sum_{l=0}^{N} a_l^2 \right)^{\frac{1}{2}}$$

i.e., the output standard deviation is $M \cdot 2^T/\sqrt{12}$ where the $a_l$ are the digital filter coefficient and N is the filter order.

If L bits per sample are being removed from the buffer, and if (from Eq. (22) and (23))

$$L - 2 < \log_2 \left[ \frac{\left( \sum_{L=0}^{N} a_l^2 \right)^{\frac{1}{2}} \cdot \left( \frac{2^T}{\sqrt{12}} \right)}{2^T} \right] = \quad (24)$$

$$0.5 \log_2 \left[ \frac{\sum_{i=0}^{N} a_i^2}{12} \right]$$

on the average more bits (just due to the truncation noise) will be added to the buffer than are removed. Then eventually the buffer will overflow. Notice that Eq. (24) does not depend on the truncation.

When the signal component is included in the compression filter output variance.

$$\sigma^2 = \sigma^2(\Delta_n) + \frac{M^2}{12} \cdot 2^{2T} \quad (25)$$

where $\sigma^2(\Delta_n)$ is the variance due to the signal. The output is scaled by $2^{-T}$ before input to the encoder. Thus the variance of the encoder input is $$2^{-2T}\sigma^2 = \sigma^2(\Delta_n) \cdot 2^{-2T} + \frac{M^2}{12} \quad (26)$$

or $$L = 2 + 0.5 \log_2 \left( \sigma^2(\Delta_n)2^{-2T} + \frac{M^2}{12} \right) \quad (27)$$

Then $$2^{2(L-2)} = \sigma^2(\Delta_n)2^{-2T} + \frac{M^2}{12} \quad (28)$$

Thus the average truncation will be $$T = -\log_2 \left( 2^{2(L-2)} - \frac{M^2}{12} \right)^{\frac{1}{2}} + \log_2 \sigma(\Delta_n) \quad (29)$$

$T = \infty$ when $$\frac{M^2}{12} = 2^{2(L-2)} \quad (30)$$

In other words, the buffer will overflow if $$M^2 > 12 \cdot 2^{2(L-2)} \quad (31)$$

Therefore for a given L only compression filters with a sufficiently small noise multiplication can be used.

A Table of Compression Filters that Result in Buffer Overflow

Eq. (28) can be rearranged so that $$q = 2^T = |(2^2(L-2) - M^2/12)|^{-\frac{1}{2}\sigma(\Delta_n)} \quad (32)$$

In other words the quantization is equal to $\sigma(\Delta_n)$ weighted by the square root term.

Table 1 is a printout of the weights for all compression filters of order of eight of less that cause overflow; the weights are a function of L. The column labeled VAR MULT gives the $M^2$. An X means that Eq. (31) is true and there is overflow at that L. The five numbers under FILTER describe the filter; the first number is the number of zeros at 0°, the second, third and fourth numbers are the number of complex zero-parts at 60°, 90° and 120°, respectively, and the fifth number is the number of zeros at 180°. For example, the first filter has four zeros at 180° but none at 0°, 60°, 90° and 120°.

TABLE 1

| FILTER | VAR. MULT | S.D. WEIGHTS: L = 3 to 8 | | | | |
|---|---|---|---|---|---|---|
| 0 0 0 0 4 | 70 | X | .314 | .131 | .063 | .031 | .016 |
| 0 0 0 0 5 | 252 | X | X | .152 | .065 | .032 | .016 |
| 0 0 0 0 6 | 924 | X | X | X | .075 | .032 | .016 |
| 0 0 0 0 7 | 3432 | X | X | X | X | .037 | .016 |
| 0 0 0 0 8 | 12870 | X | X | X | X | X | .018 |
| 0 0 0 1 3 | 132 | X | .447 | .137 | .064 | .031 | .016 |
| 0 0 0 1 4 | 490 | X | X | .208 | .068 | .032 | .016 |
| 0 0 0 1 5 | 1836 | X | X | X | .099 | .034 | .016 |
| 0 0 0 1 6 | 6930 | X | X | X | X | .047 | .017 |
| 0 0 0 2 1 | 70 | X | .314 | .131 | .063 | .031 | .016 |
| 0 0 0 2 2 | 262 | X | X | .154 | .065 | .032 | .016 |
| 0 0 0 2 3 | 988 | X | X | X | .076 | .033 | .016 |
| 0 0 0 2 4 | 3748 | X | X | X | X | .037 | .016 |
| 0 0 0 3 0 | 141 | X | .485 | .138 | .064 | .031 | .016 |
| 0 0 0 3 1 | 534 | X | X | .226 | .069 | .032 | .016 |
| 0 0 0 3 2 | 2034 | X | X | X | .108 | .034 | .016 |
| 0 0 0 4 0 | 1107 | X | X | X | .078 | .033 | .016 |
| 0 0 1 0 3 | 52 | X | .293 | .129 | .063 | .031 | .016 |
| 0 0 1 0 4 | 196 | X | X | .145 | .065 | .032 | .016 |
| 0 0 1 0 5 | 744 | X | X | .707 | .072 | .032 | .016 |
| 0 0 1 0 6 | 2838 | X | X | X | .226 | .036 | .016 |
| 0 0 1 1 2 | 106 | X | .374 | .135 | .064 | .031 | .016 |
| 0 0 1 1 3 | 404 | X | X | .182 | .067 | .032 | .016 |
| 0 0 1 1 4 | 1546 | X | X | X | .089 | .033 | .016 |
| 0 0 1 2 0 | 58 | X | .299 | .13 | .063 | .031 | .016 |
| 0 0 1 2 1 | 220 | X | X | .148 | .065 | .032 | .016 |
| 0 0 1 2 2 | 844 | X | X | X | .073 | .032 | .016 |
| 0 0 1 3 0 | 462 | X | X | .198 | .068 | .032 | .016 |
| 0 0 2 0 3 | 168 | X | .707 | .141 | .064 | .031 | .016 |
| 0 0 2 0 4 | 646 | X | X | .314 | .07 | .032 | .016 |
| 0 0 2 1 1 | 92 | X | .346 | .133 | .063 | .031 | .016 |
| 0 0 2 1 2 | 354 | X | X | .17 | .066 | .032 | .016 |
| 0 0 2 2 0 | 196 | X | X | .145 | .065 | .032 | .016 |
| 0 0 3 0 2 | 150 | X | .535 | .139 | .064 | .031 | .016 |
| 0 0 3 1 0 | 90 | X | .343 | .133 | .063 | .031 | .016 |
| 0 0 4 0 0 | 70 | X | .314 | .131 | .063 | .031 | .016 |
| 0 1 0 0 5 | 156 | X | .577 | .14 | .064 | .031 | .016 |
| 0 1 0 0 6 | 594 | X | X | .263 | .07 | .032 | .016 |
| 0 1 0 1 3 | 84 | X | .333 | .132 | .063 | .031 | .016 |
| 0 1 0 1 4 | 324 | X | X | .164 | .066 | .032 | .016 |
| 0 1 0 2 2 | 178 | X | .926 | .143 | .064 | .031 | .016 |
| 0 1 0 3 0 | 99 | X | .359 | .134 | .064 | .031 | .016 |
| 0 1 1 0 4 | 138 | X | .471 | .138 | .064 | .031 | .016 |
| 0 1 1 1 2 | 76 | X | .322 | .132 | .063 | .031 | .016 |
| 0 1 3 0 0 | 90 | X | .343 | .133 | .063 | .031 | .016 |
| 0 2 1 0 0 | 58 | X | .299 | .13 | .063 | .031 | .016 |
| 0 2 2 0 0 | 196 | X | X | .145 | .065 | .032 | .016 |
| 0 3 0 0 0 | 141 | X | .485 | .138 | .064 | .031 | .016 |
| 0 3 0 1 0 | 99 | X | .359 | .134 | .064 | .031 | .016 |
| 0 3 1 0 0 | 462 | X | X | .198 | .068 | .032 | .016 |
| 0 4 0 0 0 | 1107 | X | X | X | .078 | .033 | .016 |
| 1 0 0 0 5 | 84 | X | .333 | .132 | .063 | .031 | .016 |
| 1 0 0 0 6 | 264 | X | X | .154 | .065 | .032 | .016 |
| 1 0 0 0 7 | 858 | X | X | X | .074 | .032 | .016 |
| 1 0 0 1 4 | 124 | X | .42 | .137 | .064 | .031 | .016 |
| 1 0 0 1 5 | 414 | X | X | .184 | .067 | .032 | .016 |
| 1 0 0 2 2 | 60 | X | .302 | .13 | .063 | .031 | .016 |
| 1 0 0 2 3 | 204 | X | X | .146 | .065 | .032 | .016 |
| 1 0 0 3 1 | 102 | X | .365 | .134 | .064 | .031 | .016 |
| 1 0 1 0 5 | 138 | X | .471 | .138 | .064 | .031 | .016 |
| 1 0 1 1 3 | 70 | X | .314 | .131 | .063 | .031 | .016 |
| 1 1 2 0 0 | 92 | X | .346 | .133 | .063 | .031 | .016 |
| 1 2 0 0 0 | 70 | X | .314 | .131 | .063 | .031 | .016 |
| 1 2 1 0 0 | 220 | X | X | .148 | .065 | .032 | .016 |
| 1 3 0 0 0 | 534 | X | X | .226 | .069 | .032 | .016 |
| 1 3 0 0 1 | 102 | X | .365 | .134 | .064 | .031 | .016 |
| 2 0 0 0 5 | 72 | X | .316 | .131 | .063 | .031 | .016 |
| 2 0 0 0 6 | 198 | X | X | .145 | .065 | .032 | .016 |
| 2 0 0 1 4 | 82 | X | .33 | .132 | .063 | .031 | .016 |
| 2 0 3 0 0 | 150 | X | .535 | .139 | .064 | .031 | .016 |
| 2 1 1 0 0 | 106 | X | .374 | .135 | .064 | .031 | .016 |
| 2 1 1 1 0 | 76 | X | .322 | .132 | .063 | .031 | .016 |
| 2 1 2 0 0 | 354 | X | X | .17 | .066 | .032 | .016 |
| 2 2 0 0 0 | 262 | X | X | .154 | .065 | .032 | .016 |
| 2 2 0 0 1 | 60 | X | .302 | .13 | .063 | .031 | .016 |
| 2 2 0 1 0 | 178 | X | .926 | .143 | .064 | .031 | .016 |
| 2 2 1 0 0 | 844 | X | X | X | .073 | .032 | .016 |
| 2 3 0 0 0 | 2034 | X | X | X | .108 | .034 | .016 |
| 3 0 0 0 5 | 90 | X | .343 | .133 | .063 | .031 | .016 |
| 3 0 1 0 0 | 52 | X | .293 | .129 | .063 | .031 | .016 |
| 3 0 2 0 0 | 168 | X | .707 | .141 | .064 | .031 | .016 |
| 3 1 0 0 0 | 132 | X | .447 | .137 | .064 | .031 | .016 |
| 3 1 0 1 0 | 84 | X | .333 | .132 | .063 | .031 | .016 |
| 3 1 1 0 0 | 404 | X | X | .182 | .067 | .032 | .016 |
| 3 1 1 0 1 | 70 | X | .314 | .131 | .063 | .031 | .016 |
| 3 2 0 0 0 | 988 | X | X | X | .076 | .033 | .016 |
| 3 2 0 0 1 | 204 | X | X | .146 | .065 | .032 | .016 |
| 4 0 0 0 0 | 70 | X | .314 | .131 | .063 | .031 | .016 |
| 4 0 0 0 4 | 70 | X | .314 | .131 | .063 | .031 | .016 |
| 4 0 1 0 0 | 196 | X | X | .145 | .065 | .032 | .016 |
| 4 0 1 1 0 | 138 | X | .471 | .138 | .064 | .031 | .016 |
| 4 0 2 0 0 | 646 | X | X | .314 | .07 | .032 | .016 |
| 4 1 0 0 0 | 490 | X | X | .208 | .068 | .032 | .016 |
| 4 1 0 0 1 | 124 | X | .42 | .137 | .064 | .031 | .016 |
| 4 1 0 0 2 | 82 | X | .33 | .132 | .063 | .031 | .016 |
| 4 1 0 1 0 | 324 | X | X | .164 | .066 | .032 | .016 |
| 4 1 1 0 0 | 1546 | X | X | X | .089 | .033 | .016 |
| 4 2 0 0 0 | 3748 | X | X | X | X | .037 | .016 |
| 5 0 0 0 0 | 252 | X | X | .152 | .065 | .032 | .016 |
| 5 0 0 0 1 | 84 | X | .333 | .132 | .063 | .031 | .016 |
| 5 0 0 0 2 | 72 | X | .316 | .131 | .063 | .031 | .016 |
| 5 0 0 0 3 | 90 | X | .343 | .133 | .063 | .031 | .016 |
| 5 0 0 1 0 | 156 | X | .577 | .14 | .064 | .031 | .016 |
| 5 0 1 0 0 | 744 | X | X | .707 | .072 | .032 | .016 |
| 5 0 1 0 1 | 138 | X | .471 | .138 | .064 | .031 | .016 |
| 5 1 0 0 0 | 1836 | X | X | X | .099 | .034 | .016 |
| 5 1 0 0 1 | 414 | X | X | .184 | .067 | .032 | .016 |
| 6 0 0 0 0 | 924 | X | X | X | .075 | .032 | .016 |
| 6 0 0 0 1 | 264 | X | X | .154 | .065 | .032 | .016 |
| 6 0 0 0 2 | 198 | X | X | .145 | .065 | .032 | .016 |
| 6 0 0 1 0 | 594 | X | X | .263 | .07 | .032 | .016 |
| 6 0 1 0 0 | 2838 | X | X | X | .226 | .036 | .016 |
| 6 1 0 0 0 | 6930 | X | X | X | X | .047 | .017 |
| 7 0 0 0 0 | 3432 | X | X | X | X | .037 | .016 |
| 7 0 0 0 1 | 858 | X | X | X | .074 | .032 | .016 |
| 8 0 0 0 0 | 12870 | X | X | X | X | X | .018 |

The invention having been described in detail in accordance with requirements of the Patent Statutes, various other changes and modifications will suggest themselves to those skilled in this art. For example, the system is not limited to use in a transmitting-receiving arrangement in which information is sent over a communication channel. Obviously, the novel buffer control may be included in other arrangements such as recording and playback systems wherein the transmitter buffer output is recorded for playback at a playback unit. Also, it will be apparent that the source of digital signals $f_n$ for use with the system need not comprise A/D converter 20. That is, the invention is not limited to use in an arrangement including an A/D converter, since, a digital signal stream available from some other source may be used as an input to truncation unit 22. It will be apparent that many of the illustrated transmitter functions including truncation, compression filtering, scaling, encoding, formatting and buffering, and corresponding receiver functions may be implemented using either digital circuitry or a digital computer with suitable computer routines. Also, it will be apparent that the linear digital compression filter 28 is not limited to operation with zeros at the positions identified above, i.e. at $0°$, $\pm 60°$, $\pm 90°$, $\pm 120°$ and $180°$. Other suitable zero positions include $\pm 41.41°$, $\pm 75.52°$, $\pm 104.48°$ and $\pm 138.59°$. Also, as noted above, the term "truncation" is used herein in a broad sense to include restricting bits of the digital sample signals to selected values, and not only to a zero value. It is intended that the above and other such changes and modifications shall fall within the spirit and scope of the invention defined in the appended claims.

We claim:

1. A signal compression system for processing a stream of fixed length digital sample signals comprising,
   linear digital compression filter means for compression filtering the digital sample signals and generating a stream of equal length compression filtered signals,
   means for truncating digital sample signals supplied to said compression filter means,
   variable word length encoding means for encoding the compression filtered stream and generating a stream of encoded signals,
   buffer means into which the encoded signal stream is written and from which bits are removed,
   wherein the improvement comprises:
   means for obtaining a measure of fullness of said buffer means, and
   means for controlling the truncating means in response to said measure of fullness to substantially prevent overflow of said buffer means, truncation being increased and decreased with increased and decreased measures of fullness, respectively.

2. A signal compression system as defined in claim 1 wherein said truncating means is operable to truncate digital sample signals only when the fullness of said buffer exceeds a predetermined level.

3. A signal compression system as defined in claim 2 wherein said truncating means is operable to truncate digital sample signals only when said buffer is over substantially one-half full.

4. A signal compression system as defined in claim 1 wherein said encoding means has first and second operating modes, in said first operating mode said encoding means implementing a truncated variable word length code, in said second operating mode, comprising an out of range (OOR) operating mode, said encoding means producing an OOR code word together with the digital compression-filtered signal supplied thereto,
   means for controlling the encoding means in response to said measure of fullness of said buffer means for operation in the OOR operating mode when the contents of the buffer means decreases below a predetermined fullness level to substantially prevent underflow of said buffer means.

5. A signal compression system as defined in claim 1 including means for obtaining a measure of variance of the compression filtered signals, and
   wherein said means for controlling the truncating means is responsive both to said measure of variance and measure of fullness to substantially prevent overflow of said buffer means.

6. A signal compression system as defined in claim 5 wherein said means for controlling the truncation means includes,
   means for weighting the measure of variance and measure of fullness, and
   means for summing the weighted values to provide a measure of truncation to be employed.

7. A signal compression system as defined in claim 1 including means for obtaining a measure of the change in fullness of said buffer, and
   wherein said means for controlling the truncating means is responsive both to said measure of fullness and measure of change in fullness to substantially prevent overflow of said buffer means.

8. A signal compression system as defined in claim 7 wherein said means for controlling the truncating means also is responsive to the previous level of truncation.

9. A signal compression system as defined in claim 7 wherein the response of said truncation controlling means to said measure of change of buffer fullness increases with decreasing buffer fullness.

10. A signal compression system as defined in claim 7 wherein the response of said truncation controlling means to said measure of fullness decreases with decreasing buffer fullness and
    the response of said truncation controlling means to said measure of change of buffer fullness increases with decreasing buffer fullness.

11. A signal compression system as defined in claim 7 wherein said means for controlling the truncating means is responsive to said measure of change of fullness only with a decrease in buffer fullness.

12. A signal compression system as defined in claim 11 wherein the response of said trucation controlling means to said measure of change of buffer fullness increases with decreasing buffer fullness.

13. A signal compression system as defined in claim 11 wherein the response of said truncation controlling means to said measure of fullness decreases with decreasing buffer fullness, and
    the response of said truncation controlling means to said measure of change of buffer fullness increases with decreasing buffere fullness.

14. A signal compression system as defined in claim 13 wherein said means for controlling the truncating means also is responsive to the previous level of truncation.

15. In a signal compression system for preparing a digital sample signal stream of equal word length sample signals for transmission, or the like,
    linear digital compression filter means for compression filtering the digital sample signal stream and generating a stream of equal word length compression-filtered signals,
    digital encoding means for encoding the compression-filtered signal stream by use of a variable word length code,
    buffer means into which the encoder signal stream is written and from which bits are removed, and
    means for controlling the average bit rate from the encoding means to substantially prevent overflow of said buffer means, said controlling means including means for controlling truncation of the digital sample signal in response to a measure of fullness of said buffer means.

16. In a signal compression system as defined in claim 15 wherein bits are removed from said buffer means in blocks which include a plurality of encoded words, said means for controlling truncation being operable to change truncation between said blocks.

17. In a signal compression system as defined in claim 16 wherein said means for controlling truncation also is responsive to a measure of change in fullness of said buffer means.

18. In a signal compression system as defined in claim 17 wherein said means for controlling truncation in response to a measure of change in fullness of said buffer means is responsive to changes produced by a decrease in buffer fullness and is non-responsive to changes produced by an increase in buffer fullness.

19. In a signal compression system as defined in claim 18 wherein said means for controlling truncation also is dependent upon the truncation level employed when encoding the preceding block of signals.

20. In a signal compression system as defined in claim 15 wherein truncation is increased and decreased in response to increases and decreases, respectively, in said measure of fullness.

21. In a signal compression system as defined in claim 20 wherein said means for controlling truncation also is responsive to a measure of change in fullness of said buffer means, decrease in truncation being accelerated in response to said measure of change in fullness with a decrease in fullness of said buffere means.

22. In a signal compression system as defined in claim 20 wherein said means for controlling truncation also is responsive to a measure of variance of the compression-filtered signals from said compression filter means, truncation being increased and decreased in response to increases and decreases, respectively, in said measure of variance.

23. In a signal compression system as defined in claim 20 including means for obtaining a measure of variance of the compression filtered signals, and
wherein said means for controlling truncation also is responsive to said measure of variance, decrease in truncation being accelerated in response to a decrease in said measure of variance.

24. In a signal compression system as defined in claim 20 including means for obtaining a measure of variance of the compression filtered signals, and
wherein said means for controlling trucation also is responsive to said measure of variance, decrease and increase in truncatin being accelerated in response to a decrease and increase, respectively, in said measure of variance.

25. In a signal compression system as defined in claim 24 wherein the decrease in truncation accelerates at a faster rate than the increase in truncation in response to substantially equal decreases and increases, respectively, in variance of the compression filtered signals.

26. In a signal compression system as defined in claim 15 wherein said digital encoding means has first and second operating modes, in said first operating mode said encoding means implementing a truncated variable word length code, in said second operating mode, comprising an out of range (OOR) operating mode, said encoding means producing an OOR code word together with the digital compression-filtered signal supplied thereto, and
means for controlling the encoder means for operation in said OOR operating mode in response to said measure of fullness of said buffer means when the contents of the buffer means decreases below a predetermined fullness level to substantially prevent underflow of said buffer means.

27. In a signal compression method for preparing a digital sample signal stream of equal word length sample signals for transmission at a substantially constant bit rate, which method includes linear digital compression filtering said sample signal stream for generating a stream of compression-filtered signals, digital encoding the compression-filtered signals to generate a stream of variable word length encoded compression-filtered signals, passing the encoded signal stream to a transmission channel through buffer means, the improvement including,
truncating the sample signals before compression filtering thereof in an amount dependent upon a measure of fullness of said buffer means to substantially avoid overflow of said buffer means, truncation being increased and decreased in response to increased and decreased buffer fullness, respectively.

28. In a signal compression method as defined in claim 27 including accelerating a decrease in truncation in response to a measure of change in fullness of said buffer means with a decrease in buffer fullness.

29. In a signal compression method as defined in claim 28 wherein truncation is unaffected in response to the measure of change in fullness of said buffer means with an increase in buffer fullness.

30. In a signal compression method as defined in claim 28 including employing the previous truncation level in determining the level of truncation to be used.

31. In a signal compression method as defined in claim 30 including dividing said sample signal stream into blocks of signals, which include $N_b$ sample signals per block, determining the level of truncation, T, in accordance with the following equation.

$$T = CINT\left[\left(\frac{F}{B}\right)\left(\frac{F}{B/N_{bins}} - 1\right) + \left(1 - \frac{F}{B}\right)(T_1 + K)\right]$$

where:
CINT is a rounding function,
F is fullness of the buffer means, in bits,
B is the size of the buffer means, in bits,
$N_{bins}$ is the number of bins into which the buffer means is divided,
$T_1$ is the previous truncation level,
K = O, when buffer fullness increases,
K = $C\Delta F/N_b$, when buffer fullness decreases, where:
C is a constant, and
$\Delta F$ is the change in buffer fullness between blocks of signals.

32. In a signal compression method as defined in claim 27 including accelerating decrease in truncation in response to a measure of variance of the compression-filtered signals with a decrease in said measure of variance.

33. In a signal compression method as defined in claim 27 including accelerating decrease and increase in truncation in response to a measure of variance of the compression-filtered signals with a decrease and increase, respectively, in said measure of variance.

34. In a signal compression method as defined in claim 33 wherein the decrease in truncation is accelerated at a faster rate than the increase in truncation in response to substantially equal decreases and increases, respectively, in variance of the compression-filtered signals.

35. In a signal compression system, the combination including
    digital encoding means having first and second operating modes for use in encoding digital input signals from digital compression filter means,
    in the first operating mode, said digital encoding means implementing a trucated variable length code whereby those input signals which are within a predetermined signal range are encoded using a variable word length code, and those which are outside said predetermined signal range are labeled with an out of range (OOR) code word,
    in the second operating mode, said digital encoding means labeling all input signals which are both inside and outside said predetermined signal range with the (OOR) code word, the average output bit rate of said digital encoding means being greater in the second operating mode than in the first operating mode, and
    mode control means for selecting the operating mode of said digital encoding means.

36. In a signal compression system as defined in claim 35 including
    buffer memory means into which the output from said digital encoding means is written,
    means for reading from said buffer memory means at a substantially constant bit rate,
    said mode control means being responsive to a measure of the fullness of the buffer memory means for controlling said encoding means to avoid underflow of said buffer memory means.

37. In a signal compression system as defined in claim 36 wherein said digital encoding means is switched to the second operating mode when the buffer memory means approaches underflow.

38. A signal compression system for processing a stream of fixed length digital sample signals comprising,
    linear digital compression filter means for compression filtering the digital sample signals and generating a stream of equal length compression filtered signals,
    variable word length encoding means operable in a first operating mode which implements a truncated variable word length code for encoding the compression filtered stream and generating a stream of variable word length encoded signals.
    buffer means into which the encoded signal stream is written and from which bits are removed.
    means for obtaining a measure of fullness of said buffer means.
    said encoding means being controllably operable for operation in a second, out of range (OOR), operating mode wherein an (OOR) code word together with the digital compression filtered signal supplied thereto is outputted from the encoding means when operated in said OOR operating mode.
    means for controlling said encoding means for operation in said (OOR) operating mode when the contents of said buffer means decreases below a predetermined level of fullness to substantially prevent underflow of said buffer means.

* * * * *